Aug. 5, 1969 S. TRIEBWASSER 3,459,944

PHOTOSENSITIVE INSULATED GATE FIELD EFFECT TRANSISTOR

Filed Jan. 4, 1966

INVENTOR.
SOL TRIEBWASSER

BY

John E. Dougherty Jr.
ATTORNEY

United States Patent Office 3,459,944

Patented Aug. 5, 1969

3,459,944

PHOTOSENSITIVE INSULATED GATE FIELD EFFECT TRANSISTOR

Sol Triebwasser, Peekskill, N.Y., assignor to International Business Machines Corporation, Armonk, N.Y., a corporation of New York Filed Jan. 4, 1966, Ser. No. 518,643
Int. Cl. H01l *11/14*, H01j *39/12*
U.S. Cl. 250—211 1 Claim

ABSTRACT OF THE DISCLOSURE

A photosensitive field effect device is formed of a body of p type silicon with two separated n regions at one surface of the body, which are connected to source and drain electrodes for the device. A gate electrode is affixed to the body bridging the area between the two n regions and this gate electrode is separated from the silicon by a layer of insulating material. The device is prepared so that a channel extending between the two n regions beneath the gate electrode is in the form of an inversion layer which is n type so that there is normally a current path from the source to drain. Radiant energy is applied to this channel through the gate electrode which is transparent to the radiant energy. The device is controlled by the combination of the input radiant energy and the input voltage applied to the gate electrode. These inputs control the conductivity of the channel and modulates the current through a load which is connected in a source and drain circuit. In the preferred mode of operation, the voltage at the gate electrode is maintained sufficiently high so that the channel is rendered nonconductive. The channel remains nonconductive even when a signal is applied by a signal source to the gate electrode to lower the voltage at that electrode. Conduction through the channel and, therefore, through the load is produced only when radiant energy is also applied in combination with the application of the signal to the gate electrode. The radiant energy, of and by itself, is not sufficient to produce conduction in the presence of bias voltage on the gate unless the signal source in also activated to apply a signal to the gate at the same time that the radiant energy is applied. Since the gate is insulated from the body, the control circuit for the gate does not produce any continuous current in the device.

The present invention relates to photoresponsive semiconductive devices and more particularly to a photoresponsive insulated gate field effect transistor device.

It is, of course, known that the conductivity characteristics of semiconductor material can be controlled by the application of radiant energy which produces hole-electron pairs in the semiconductor material. This effect has been used in phototransistors which include, for example, two regions of n-type material separated by a region of p-type material. The adjoining regions of different conductivity type form two p-n junctions in the body. In a common mode of operation one of these junctions is forward biased and the other reverse biased and there is no current flow through the device. By the application of radiant energy of proper frequency, sufficient hole-electron pairs can be produced in the central region p-type region to allow current flow through the transistor. Insulated gate field effect transistors are also known in the art and commonly include two regions of one conductivity type, for example, n-type separated by a p-type region forming therewith two p-n junctions. The two n-type regions are usually referred to as source and drain and a bias voltage is applied to these regions to forward bias one junction and reverse bias the other junction. The conductivity between source and drain is controlled by applying signals to a gate electrode mounted on the surface of the body and bridging the portion of the body separating the source and drain electrodes. The voltage signals applied to the gate electrode produce electric fields which alter the conductivity characteristics of at least a channel in the material separating source and drain and allow current flow between these two regions. In this type of field effect device the gate is insulated from the surface of the semiconductor body and in another form the gate electrode makes ohmic connection to the semiconductor body. Field effect devices of the latter type have been used in photoresponsive applications in which the input radiant energy changes the conductivity of the gate region and alters current flow in the gate circuit. This current flow in the gate circuit generates a voltage at the gate electrode which in turn produces an electric field that is applied to the gate region. This field alters the conductivity of the region so that an amplified current flow is obtained between source and drain. One example of this type of device is described in U.S. Patent No. 3,051,840 issued on Dec. 18, 1959, to E. M. Davis. Though devices of this type have been successfully employed to produce amplified outputs in response to input radiant energy, they require continuous current flow in the gate circuit to achieve this amplification and are controlled solely by the input radiant energy.

In accordance with the principles of the present invention a photoresponsive semiconductor field effect device is provided which can be controlled by the combination of radiant energy and electrical signal inputs. Further, this device does not require current flow with the attendant losses in the gate circuit as has been the case with the prior art devices. In one embodiment of the subject invention disclosed, by way of example, the novel structure includes a planar field effect transistor with source, drain and gate regions and electrodes for each of these regions with the gate electrode insulated from the body of the semiconductor material. In this one embodiment a narrow inversion layer is formed along the surface of the device beneath the gate electrode. This inversion layer is of the same conductivity type as the source and drain regions and the device is normally in an on condition in that there is current flow in the source-drain circuit. By the application of a bias voltage of proper polarity to the gate, the device can be turned off. The input radiant energy is applied through the gate and if the bias voltage applied to the gate is not too large, the input radiant energy is effective to establish a conduction path between source and drain. In another more specific mode of operation a continuous large bias voltage is applied to the gate and a signal source is connected to the gate which applies input signals of polarity to reduce the gate bias. The bias voltage at the gate is such however, that even in the presence of the input signal the device remains off unless and until a radiant energy input is also applied. Similarly, the radiant energy input is not effective to turn the device on in the presence of the bias voltage on the gate unless an input electrical signal is applied to the gate.

Therefore, it is an object of the present invention to provide an improved photosensitive semiconductor device.

It is another object of the present invention to provide a semiconductor photosensitive device which is controllable both by electrical and radiant energy inputs.

It is a more specific object to provide a photosensitive field effect transistor device in which the gate electrode for the device is insulated from the body of semiconductor material forming the device and in which the response of the device to input radiant energy is controllable by voltages applied to the gate.

It is still another object of the present invention to provide an improved semiconductor photosensitive device which can be controlled either by electrical or radiant energy inputs and more specifically to provide such a device in which the response of the device to one type of input can be controlled by the selective application of the other type input.

The foregoing and other objects, features and advantages of the invention will be apparent from the following more particular description of preferred embodiments of the invention, as illustrated in the accompanying drawings.

Figure 1:
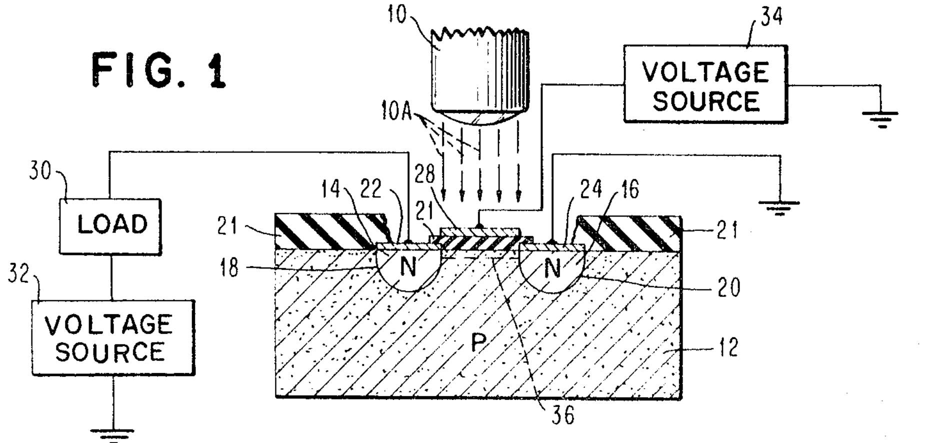
FIG. 1 is a partly schematic view of a photosensitive field effect device embodying the present invention.

The structure of FIG. 1 is a basically that of an insulated gate field effect transistor to which a selectively controlled light source 10 has been added. The insulated gate field effect transistor includes a bulk p-region 12 into which two n-regions 14 and 16 have been diffused to form two p-n junctions 18 and 20. These junctions extend to the surface of the crystal body which is covered with an insulating layer of silicon dioxide 21 portions of which have been broken away in order to illustrate more clearly the electrical connections to the device. Ohmic connections 22 and 24 are made to the *n* regions 14 and 16. A gate electrode 28 is mounted above the portion of the crystal separating the two junctions 18 and 20 on the upper surface of the device. Gate electrode 28 bridges these two junctions and is separated from the upper surface of the crystalline body by silicon dioxide layer 21, it being noted that this layer of silicon dioxide between the gate and the upper surface of the crystal is thinner than the overall layer applied as is indicated at the ends of the surface of the crystal. Ohmic connection 24 is connected to ground and ohmic connection 22 is connected through a load 30 to a voltage source 32. The electrode 22 is, therefore, the drain electrode and the electrode 24 is the source electrode. Another voltage source 34 is connected to gate electrode 28. The gate electrode is made transparent to allow radiant energy from a controllable light source 10 to pass through this electrode and the layer 21 of silicon dioxide to the upper surface of the crystal body.

Though, as has been stated above, the bulk of the crystal body is p-material, it is usual in the preparation of insulated gate field effect transistors of the type shown that a very thin inversion layer of n-type material is produced at the upper surface of the crystal extending between the two n-type regions 14 and 16. This inversion layer forms a channel between these regions which is represented at 36. It is possible, of course, to avoid this inversion layer by taking the necessary precautions during the preparation of the device, but the preferred embodiment disclosed herein by way of example includes the n-type layer extending between the two n-type regions 14 and 16.

Figures 2, 3:
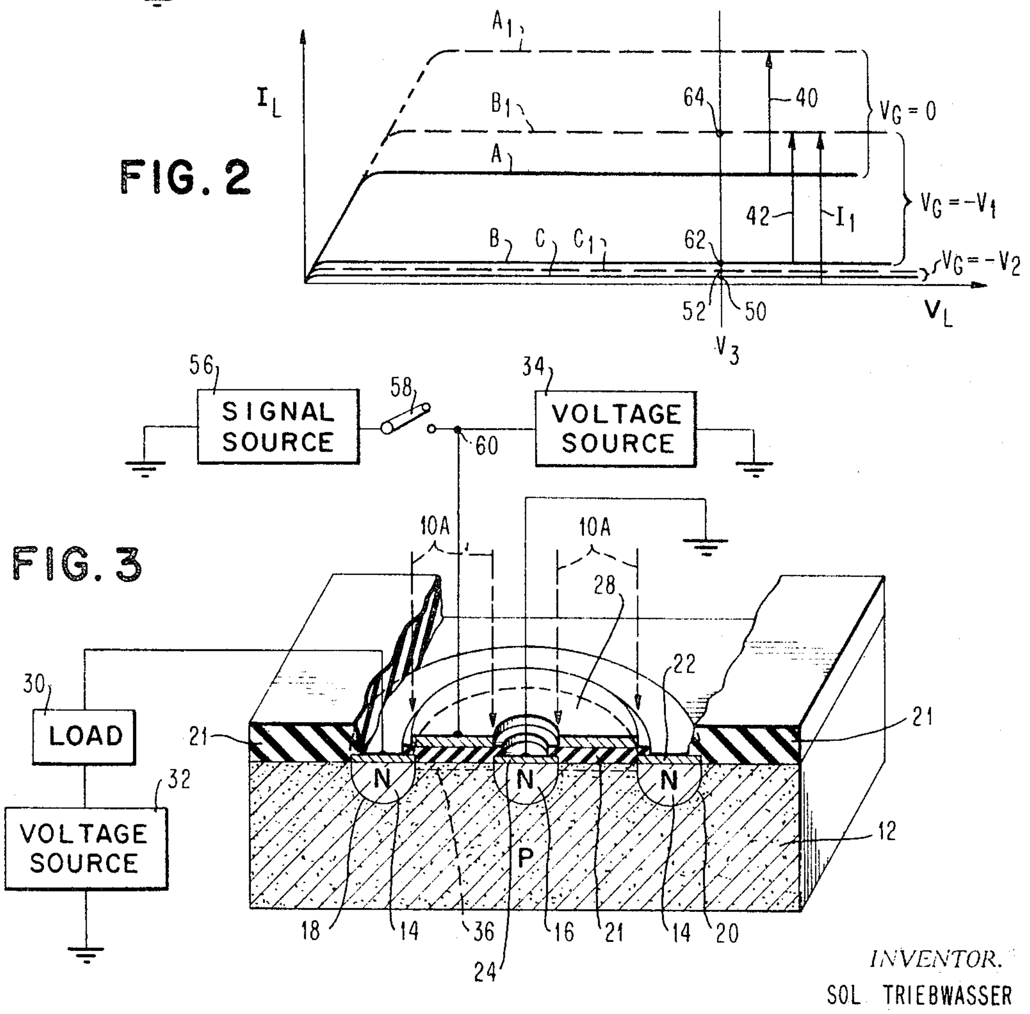
FIG. 2 is a plot depicting the voltage-current characteristics of the source drain current for various light and electrical inputs applied to the device of FIG. 1.
FIG. 3 is a view of another photosenstive field effect structure embodying the present invention.

Even though the voltage applied by source 32 is positive and reverse biases junction 18, the n-layer 36 provides a conductive path between the two n-region 14 and 16. As a result curent does flow in the source-drain circuit including the load 30 in the absence of either a voltage applied by source 34 to the gate 28 or input radiation from the controllable light source 10. This condition is indicated in FIG. 2 by the continuous line curve designated A. This figure is a plot of the source-drain or load current $I_L$ versus the voltage $V_L$ applied by voltage source 32 in FIG. 1. In the plot the full line curves represent circuit characteristics in the absence of imput radiant energy for different values of gate voltage $V_G$ and the dashed curves represent the circuit characteristics when radiant energy is applied.

Activation of the controlled light source 10 to apply radiation as represented by arrows 10A through the transparent gate electrode 28 and insulating layer 21 at the upper surfaces of the crystal body separating the source and drain increases the source-drain current. This condition is represented by the curve $A_1$ in FIG. 2, and an arrow 40 extending between curves A and $A_1$ indicates the increase in the source-drain current achieved by applying radiant energy to the channel beneath gate 28. The energy of the light input is absorbed in the semiconductor material by producing hole-electron pairs in the material. Stated another way the photons associated with the light input transfer energy to electrons in the valence band in the material and in the transfer move these electrons into the conduction band thereby creating hole-electron pairs. As a result, there are more electrons available in the conduction band to transfer current between the source and drain and the current $I_L$ increases as indicated by the arrow 40. It is of course, necessary that the input light be in the proper wavelength to produce hole-electron pairs in the semiconductor material. Assuming, for example, that the material is silicon, the input light would be typically in the wavelength range from 4500 angstroms to 9500 ansgstroms.

If in the absence of input light energy, when voltage source 34 applies a negative voltage $-V_1$ to the gate electrode 28, through a capacitive type of action with the layer 21 of silicon dioxide serving as the dielectric below the gate 28, a negative charge is build up on gate 28 and a positive charge on the channel 36. This positive charge in effect changes the n-type region 36 to a p-type region so that there is now truly a complete barrier to the flow of current from the source to the drain with the junction 18 being reversed biased. This condition is represented by the full line curve designated B in FIG. 2 which is plotted to indicate that there is essentially no source-drain current when gate electrode 28 is biased with the voltage $-V_1$ and no light input is applied. However, as is indicated by the curve $B_1$ if light source 10 is activated to apply a radiant energy input, hole-electron pairs are again produced in the channel between the drain region 14 and source region 16 to allow current to flow in the source-drain circuit. The arrow 42 between curves B and $B_1$ in FIG. 2 indicates the increase in source-drain current obtained by applying the radiant energy to the device when it has been cut off by the application of the negative voltage $-V_1$ to gate 28. The curves A, $A_1$, B and $B_1$ in FIG. 2 illustrate four different operating conditions for the device of FIG. 1 achieved by selective control of the voltage at the gate electrode in combination with the application of radiant energy to the channel separating the source and drain.

If the voltage source 34 applies a voltage $-V_2$ more negative than $-V_1$ to the gate electrode 28 to cut off the device, the condition represented by full line curve C in FIG. 2 is obtained. The source-drain current in the presence of this larger negative gate voltage is essentially the same as that when the voltage is at $-V_1$ but the voltage $-V_2$ is effective to prevent the flow of source-drain current even when a radiant energy input is applied. This condition is represented by the curve $C_1$.

It should be further noted that for each of the operating conditions depicted in FIG. 2, since the gate 28 is insulated from the channel in the device between source and drain, there is no current flow in the gate circuit except for the transient necessary to charge the capacitor and this control circiut is effectively isolated from the load circuit including the source and drain.

FIG. 3 illustrates a further embodiment of the invention which differs somewhat in geometrical structure of the semiconductor device, and in which current flows in the source-drain circuit through the load only when both an input electrical signal is applied to the gate and a radiant energy input is applied to the channel separating the source and drain region. In this embodiment the same numerals as were used in FIG. 1 have been used to designate like components. Again the basic semiconductor crystal is p-type as indicated at 12 and the two n-type regions which have been diffused to form the source and drain have a different geometry than that in FIG. 1. In FIG. 3 one half of a symmetrical structure is shown in which the source regions designated 16 is a centrally located diffused region. The n-type drain region 14 is circular in form and surrounds the region 16. A continuous circular junction 18 is formed between n-type region 14 and the p-bulk material 12 and another junction 20 is formed between the n-type region 16 and the bulk of p-material 12. The channel separating the source region 16 from the drain region 14 is again represented at 36 and has an annular configuration. The gate electrode again designated 28 is mounted above channel 36 and is separated from the upper surface of the body by a layer of insulating material 21.

The light input to the device is represented by the arrows 10A and is applied to the entire channel 36 separating the source and drain regions. This radiative energy, is supplied by a controllable light source such as that shown at 10 in FIG. 1 having the proper configuration and focusing to radiate the light through the transparent electrode 20 and insulating layer 21 to the channel separating the source and drain regions 14 and 16. The light source may be electrically controllable or a shuttering mechanism may be used to selectively interrupt the light from the source so that it does not reach the semiconductor device. The shuttering operation may be performed, for example, by documents which are selectively perforated or include transparent and opaque sections so that light is allowed to reach the semiconductor device according to the transmitting characteristics of the particular section of the document which separates the light source from the device.

In the particular application to which the embodiment of FIG. 3 is directed, the voltage source 32, which supplies voltage to the source drain circuit including load 30, applies a constant voltage which is represented at $V_3$ in FIG. 2. The voltage source 34 connected to gate electrode 28 applies a negative bias voltage $-V_2$ which is a large negative voltage that cuts off the current flow between source and drain. The operating point for the circuit is at point 50 in FIG. 2 with essentially no source drain current flowing. If the light source is now activated to apply light energy 10A to the channel between source and drain, the operating point is moved from 50 to 52 in FIG. 2. Again there is essentially no current flow between source and drain, the bias voltage applied by source 34 being sufficiently negative to prevent current flow between source and drain even in the presence of the radiant energy input.

The embodiment of FIG. 3 includes a signal source 56 which is not found in the embodiment of FIG. 1. This source, through a switch 58, applies to a terminal 60 a sufficient positive voltage signal to change the voltage at the gate from the value $-V_2$ to the value $-V_1$. In the absence of a radiant energy input from the light source, the operating point is at 62 in FIG. 2 again with no source-drain current flowing. If, however, switch 58 is activated to apply the positive voltage signal to the terminal 60 at a time when a radiant energy input is also applied, the operating condition of the circuit is represented at point 64 in FIG. 2 with an appreciable source-drain current $I_1$ flowing. It can thus be seen that it is only when the electrical input signal of proper polarity is applied in combination with input light energy that the device becomes conductive. In the absence of both of these inputs at the same time no current is conducted through the load circuit.

The photoresponsive field effect device of the present invention can be operated not only in the specific modes described above but in a number of other modes wherein different combinations of light and electrical inputs control the flow of current through the source and drain circuit. Further, though in the embodiments disclosed herein are n-p-n type devices, p-n-p type devices can, of course, be employed with appropriate polarity bias and control signals applied to achieve similar modes of operation. It should be also noted that it is possible, as mentioned above, to fabricate insulated gate field effect devices in which there is no inverted layer at the surface immediately beneath the gate. Such devices are normally off devices, that is in the absence of any electrical voltage applied to the gate or in the absence of any light input no current flows in the load circuit. These devices can be operated in accordance with the principles disclosed above using combinations of gate signals and light inputs to achieve control of the current between source and drain.

While the invention has been particularly shown and described with reference to preferred embodiments thereof, it will be understood by those skilled in the art that various changes in form and details may be made therein without departing from the spirit and scope of the invention.

What is claimed is:

1. A radiant energy responsive circuit comprising:

(a) an insulated gate field effect transistor of the type including a body of semiconductor material primarily of a first conductivity type having at one surface first and second spaced regions of opposite conductivity type forming first and second junctions and a gate electrode mounted above said one surface and insulated therefrom extending above the space between first and second regions;

(b) first current means coupled to said first and second junctions for forward biasing one of said junctions and reverse biasing the other of said junctions;

(c) first and second independently operable input means for applying inputs to said transistor for controlling the conductivity characteristics of a channel at said one surface of said semiconductor body connecting said first and second regions;

(d) said first input means comprising a radiant energy source for applying radiant energy to said channel to produce hole-electron pairs in said channel, said gate electrode being transparent to said radiant energy and said radiant energy being applied through said gate electrode to said channel;

(e) said second input means comprising circuit means coupled to said gate electrode for applying either a first voltage or a second voltage at said gate electrode to control the conductivity characteristics of said channel;

(f) said second input means including bias means for biasing said gate electrode at said first voltage and signal applying means for applying signals to change the voltage at said gate to said second voltage;

(g) said signal applied by said signal applying means being of opposite polarity to reduce the charge of said one conductivity type at said channel;

(h) the radiant energy applied by said radiant energy source being sufficient to cause conduction between said first and second regions when said gate is at said second voltage but being ineffective to cause conduction between said first and second regions when said gate electrode is at said first voltage;

(i) and means for selectively controlling said first and second inputs to apply electrical signals to said gate electrode to control the conductivity of said channel in accordance with the combination of inputs applied.

References Cited

UNITED STATES PATENTS

| | | | |
|---|---|---|---|
| 3,096,442 | 7/1963 | Sewart | 250—211 |
| 3,051,840 | 8/1962 | Davis | 317—235 |
| 3,243,669 | 3/1966 | Chih-Tang Sah | 317—23 |
| 3,263,095 | 7/1966 | Fang | 317—235 |
| 3,283,221 | 11/1966 | Heiman | 317—235 |

WALTER STOLWEIN, Primary Examiner

MARTIN ABRAMSON, Assistant Examiner

U.S. Cl. X.R.

317—235